US009613992B2

(12) United States Patent
Shahar et al.

(10) Patent No.: US 9,613,992 B2
(45) Date of Patent: Apr. 4, 2017

(54) DETECTOR MODULE FOR AN IMAGING SYSTEM

(71) Applicant: GENERAL ELECTRIC COMPANY, Schenectady, NY (US)

(72) Inventors: Arie Shahar, Rehovot (IL); Eliezer Traub, Rehovot (IL); Israel Altman, Rehovot (IL)

(73) Assignee: GE MEDICAL SYSTEMS ISRAEL, LTD, Brookfield, WI (US)

( * ) Notice: Subject to any disclaimer, the term of this patent is extended or adjusted under 35 U.S.C. 154(b) by 230 days.

(21) Appl. No.: 13/924,690

(22) Filed: Jun. 24, 2013

(65) Prior Publication Data
US 2014/0374869 A1 Dec. 25, 2014

(51) Int. Cl.
*H01L 27/144* (2006.01)
*H01L 31/0216* (2014.01)
*H01L 31/18* (2006.01)
*G01T 1/24* (2006.01)
*H01L 27/146* (2006.01)

(52) U.S. Cl.
CPC ............ *H01L 27/1446* (2013.01); *G01T 1/24* (2013.01); *G01T 1/243* (2013.01); *H01L 27/14618* (2013.01); *H01L 27/14659* (2013.01)

(58) Field of Classification Search
CPC .... H01L 31/0216; H01L 27/144; H01L 31/18
See application file for complete search history.

(56) References Cited

U.S. PATENT DOCUMENTS

| 5,905,264 | A | 5/1999 | Shahar et al. | |
|---|---|---|---|---|
| 6,034,373 | A | 3/2000 | Shahar et al. | |
| 7,339,176 | B2 | 3/2008 | El-Hanany et al. | |
| 8,441,091 | B2 | 5/2013 | Zeman et al. | |
| 2009/0261265 | A1* | 10/2009 | Hahn | G01T 1/2935 250/375 |
| 2012/0049054 | A1* | 3/2012 | Zhou | B82Y 15/00 250/265 |
| 2012/0068289 | A1* | 3/2012 | Alie et al. | 257/432 |
| 2012/0146174 | A1* | 6/2012 | Zeman et al. | 257/446 |
| 2012/0200964 | A1* | 8/2012 | Van Camp | H01L 27/0255 361/56 |
| 2013/0126998 | A1 | 5/2013 | Shahar et al. | |

(Continued)

FOREIGN PATENT DOCUMENTS

WO WO 2013141701 A1 * 9/2013

*Primary Examiner* — Dale E Page
*Assistant Examiner* — Lamont Koo
(74) *Attorney, Agent, or Firm* — Dean D. Small; The Small Patent Law Group, LLC

(57) ABSTRACT

A detector module for detecting photons includes a detector formed from a semiconductive material, the detector having a first surface, an opposing second surface, and a plurality of sidewalls extending between the first and second surfaces, and a guard band coupled to the sidewalls, the guard band having a length that extends about a circumference of the detector, the guard band having a width that is greater than a thickness of the detector such that an upper rim segment of the guard band projects beyond the first surface of the detector, the upper rim segment being folded over a peripheral region of the first surface along the circumference of the detector, the guard band configured to reduce recombinations proximate to the edges of the detector.

12 Claims, 6 Drawing Sheets

(56) References Cited

U.S. PATENT DOCUMENTS

| | | |
|---|---|---|
| 2013/0126999 A1 | 5/2013 | Rusian et al. |
| 2013/0264481 A1* | 10/2013 | Chern et al. ............... 250/358.1 |
| 2014/0117246 A1* | 5/2014 | Zhou ....................... G01T 3/008 |
| | | 250/375 |
| 2015/0076661 A1* | 3/2015 | Musk ........................... 257/615 |

\* cited by examiner

DETECTOR MODULE FOR AN IMAGING SYSTEM

BACKGROUND OF THE INVENTION

The subject matter described herein relates generally to imaging systems, and more particularly, to a methods and devices for reducing leakage currents in an imaging system detector.

Radiation detectors may be used in a wide variety of applications. For example, radiation detectors may be used in medical imaging systems to capture images of objects. The captured images may diagnostic images of a person or an animal which are then used by a doctor or other health care professional in making a diagnosis. Radiation detectors may also be used to image luggage, shipping containers, as well as for industrial inspection. Radiation detectors also may be used for non-imaging applications, such as for security detection and identification of radionuclides. In these non-imaging applications, the spectral response for the radiation detectors is used.

The radiation detectors may be, for example, pixelated radiation detectors, such as Cadmium Zinc Telluride (CZT) detectors, which are increasingly used. In these systems, the signal levels (e.g., the amount of signal generated by an x-ray or Gamma event) from the detector are often extremely small and easily corrupted by digital activity within the system. For example, the digital communication links within the system can generate noise that interferes with the signals from the detectors. However, signals are needed for controlling the system, such as the state of the system, transitions between different operations, etc., for example, during data acquisition.

In general, CZT detectors are fabricated using a large quantity of components that are closely spaced to each other to enable a plurality of CZT detectors to be positioned on a single board. As such, the various components used to fabricate the CZT detector are generally spaced relatively closely to each other. Moreover, at least one known CZT detector operates using approximately 600 volts that is supplied to the CZT detector using a high voltage (HV) connector.

However, in some operating conditions, humidity may form between one or more components in the CZT detector. As one example, humidity may form between the HV strip and other components. The humidity, e.g. moisture, may therefore reduce the electrical isolation between the HV connector and the other components. More specifically, the humidity may cause leakage currents or crosstalk signals to be generated in the CZT detector. As a result, the CZT detector may generate false events or false hits to be generated. Moreover, because true and false hits cannot be distinguished after detection, these false hits are not accounted for in the subsequent signal processing. These incorrect counts (e.g., an incorrect number of photon counts) that are added to the relevant energies may cause significant image artifacts, thereby decreasing image quality and reducing the reliability of image acquisition results and any analysis of these images thereafter.

SUMMARY OF INVENTION

In one embodiment, a detector module for detecting photons is provided. The detector module includes at least one detector module. The detector module includes a detector formed from a semiconductive material, the detector having a first surface, an opposing second surface, and a plurality of sidewalls extending between the first and second surfaces, and a guard band coupled to the sidewalls, the guard band having a length that extends about a circumference of the detector, the guard band having a width that is greater than a thickness of the detector such that an upper rim segment of the guard band projects beyond the first surface of the detector, the upper rim segment being folded over a peripheral region of the first surface along the circumference of the detector, the guard band configured to reduce electron-hole (e-h) recombinations proximate to the edges of the detector.

In another embodiment, another detector module for detecting photons is provided. The detector module includes a detector formed from a semiconductive material, the detector having a first surface, an opposing second surface, and a plurality of sidewalls extending between the first and second surfaces, and a cathode plate attached to the first surface, the cathode plate including a plurality of underfill injection openings extending there-through, the underfill injection openings configured to receive an underfill material therethrough.

In another embodiment, a radiation detector is provided. The radiation detector includes a Detector Carrier Board (DCB) and a plurality of detector modules coupled to the DCB. At least one of the detector modules includes a detector formed from a semiconductive material, the detector having a first surface, an opposing second surface, and a plurality of sidewalls extending between the first and second surfaces, a cathode plate attached to the first surface, the cathode plate including a plurality of underfill injection openings extending therethrough, the underfill injection openings configured to receive an underfill material therethrough and a guard band coupled to the sidewalls, the guard band having a length that is approximately equal to a circumference of the detector and a width that is greater than a thickness of the detector such that a portion of the guard band is disposed on the first surface of the detector.

In a further embodiment, a method of fabricating a detector module for detecting photons is provided. The method includes providing a detector formed from a semiconductive material, the detector having a first surface, an opposing second surface, and a plurality of sidewalls extending between the first and second surfaces and coupling a guard band to the detector such that a first portion of guard band is coupled to the sidewalls and a second portion of the guard band is coupled to the first surface of the detector.

TAILED DESCRIPTION

Figure 1:
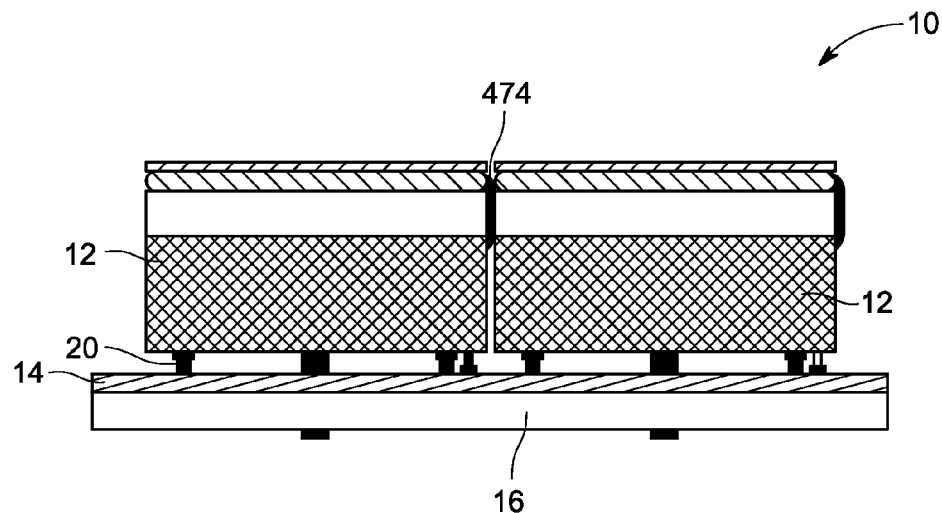
FIG. 1 is a cross-sectional view of an exemplary detector array formed in accordance with various embodiments

The following detailed description of certain embodiments will be better understood when read in conjunction with the appended drawings. To the extent that the figures illustrate diagrams of the functional modules of various embodiments, the functional blocks are not necessarily indicative of the division between hardware circuitry. Thus, for example, one or more of the functional blocks (e.g., processors or memories) may be implemented in a single piece of hardware (e.g., a general purpose signal processor or a block of random access memory, hard disk, or the like). Similarly, the programs may be stand-alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Various embodiments provide systems and methods for reducing false events or false hits that may occur in a detector module. In one embodiment, the detector module includes a detector and a guard band to cover both the sidewalls of the detector and also to partially overlap a surface of the detector. In operation, the guard band functions to reduce and/or eliminate e-h recombinations that may occur proximate to the sidewalls of the detector.

In various other embodiments, false hits may occur due to humidity forming between various components in the detector module. Accordingly, another embodiment provides a plurality of openings that extend through a cathode plate mounted on the detector. In operation, the plurality of openings enable an underfill material to be injected into and between various components in the detector module to reduce and/or eliminate voids that are susceptible to moisture.

In another embodiment, a high-voltage (HV) strip is provided. The HV strip includes multiple layers and an adhesive material to bond the multiple layers together. During assembly, the adhesive layer is configured to extend a predetermined distance from the edges of the layers to reduce areas proximate to the edges of the HV strip where condensation may occur.

In a further embodiment, the detector module includes an analog-front-end (AFE) board that is wider than a width of the detector. Thus, when multiple detector modules are assembled together to form a detector array, each detector module is separated from an adjacent detector module by a predetermined distance. The predetermined distance is selected to reduce and or eliminate humidity trails that may occur between the HV strip on a first detector module and an adjacent detector module.

The various embodiments may be implemented within radiation detector arrays, which in various embodiments are radiation detector arrays having direct detection or direct conversion detectors. For example, the radiation detector arrays in some embodiments include pixelated radiation detectors for detecting x-rays or gamma rays, such as Cadmium Zinc Telluride (CZT) detectors. The various embodiments may be implemented, for example, in connection with Computed Tomography (CT) systems, Single-Photon Emission Computed Tomography (SPECT) systems and Positron Emission Tomography (PET) systems, among other nuclear medicine and x-ray radiation detector systems, which may be single modality or multi-modality systems. Thus, the various embodiments may be implemented in connection with radiation detector arrays in different types of imaging systems. Applications of radiation detector arrays include in addition to medical applications, security applications, industrial inspection applications, and/or the like. Thus, although embodiments are described and illustrated herein with respect to a particular radiation detector arrays having detectors that detect a specific type of radiation, such as ionizing, X-ray and Gamma radiation. The various embodiments may be used in other application and may be used to detect other types of electromagnetic energy.

Figure 2:
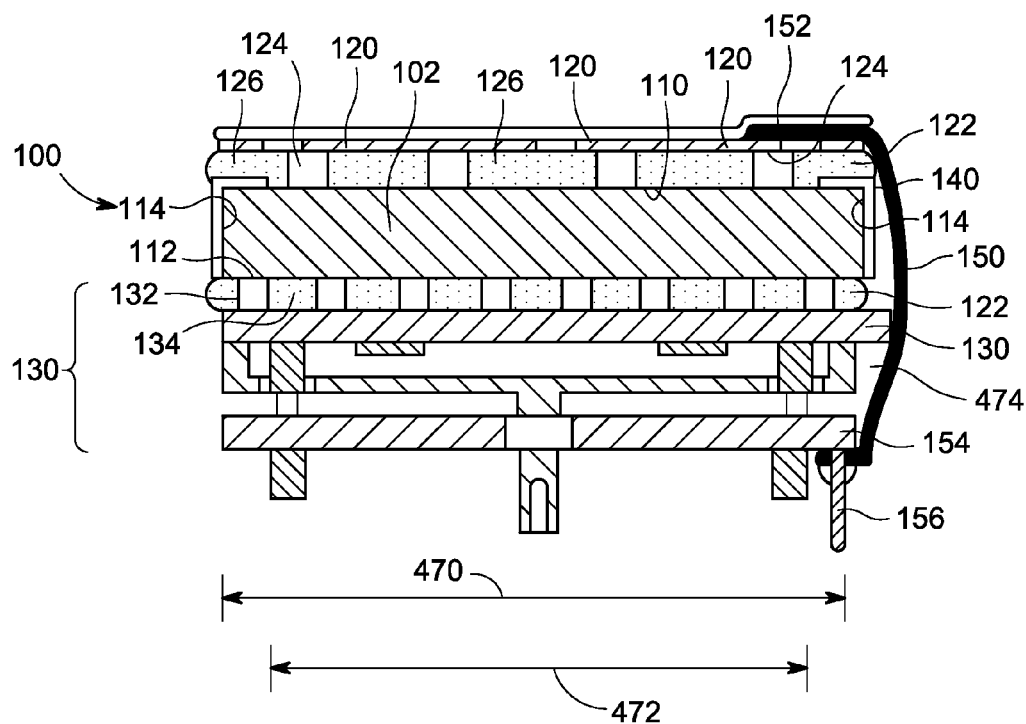
FIG. 2 is a simplified cross-sectional view of a detector module formed in accordance with various embodiments.

Referring now to FIG. 1, FIG. 1 is a side view of a portion of an exemplary detector array 10 formed in accordance with various embodiments. In one embodiment, the detector array 10 includes a plurality of individual detector modules 12 that are each mounted to a Detector Carrier Board (DCB) 14 which may be implemented as a Printed Circuit Board (PCB). The detector array 10 further includes processing and/or communication circuitry 16. During assembly, the detector modules 12 are mounted to the DCB 14 using a plurality of pins 20, e.g. a Pin Grid Array (PGA) that may be inserted into a respective plurality of sockets (not shown) formed in the DCB 14. Alternatively, pins 20 may be connectors 20 on which the detector modules 12 are mounted FIG. 2 is a cross-sectional view of an exemplary detector module 100 that may be used with the detector array 10 shown in FIG. 1. In various embodiments, the detector module 100 includes a detector 102. The detector 102 includes a first surface 110, also referred to herein as a photon detecting surface, and an opposing second surface 112. The detector 102 also includes a plurality of sidewalls 114 extending between the first surface 110 and the second surface 112. It should be realized that although only two sidewalls 114 are shown in FIG. 2, that the detector 102 includes four sidewalls 114 such that the detector 102 has a substantially square or rectangular shape.

In various embodiments, the detector 102 is either a unitary structure or includes several tiles butted together into a united form that is fabricated from a semiconductive material. For example, the detector 102 may be fabricated from a direct conversion material (e.g., Cadmium Telluride (CdTe) or CZT). It should be noted that as used herein, a direct conversion material generally refers to any detector material that directly converts (in a single conversion step) photons or other high frequency gamma ray energy to electrical signals instead of in a multi-step process such as when using a scintillator (e.g., NaI:Tl (thallium-doped sodium iodide)) and a photo-conversion device (e.g., a photo-diode or Photo-Multiplier (PMT)).

The detector module 100 also includes a cathode plate 120 and an underfill material 122 which in various embodiments is electrically insulates. More specifically, the cathode plate 120 is coupled to the detector 102 via a set of bumps or standoffs 124 (covered by under fill 122). The standoffs 124 are sized to separate the cathode plate 120 from the detector 102 by a predetermined distance. In the exemplary embodiment, the standoffs 124 are fabricated using a conductive epoxy. It should therefore be realized that the standoffs 124 create a plurality of gaps 126 between the cathode plate 120 and the detector 102. Accordingly, the underfill material 122 is utilized to fill the gaps 126. The underfill material 122, may have for example, a relatively low viscosity to enable the underfill material 122 to be injected into the gaps 126 during assembly of the detector module 100. The method of filling the gaps 126 using the underfill material 122 is described in more detail below.

In various embodiments, the second surface 112 of the detector 102 is coupled to an analog front end (AFE) 130. More specifically, the detector 102 is coupled to the AFE 130 via a second set of bumps or standoffs 132. The standoffs 132 are sized to separate the detector 102 from the AFE 130 by a predetermined distance. In the exemplary embodiment, the standoffs 132 are fabricated using a conductive epoxy. It should therefore be realized that the standoffs 132 create a plurality of gaps 134 between the detector 102 and the AFE 130. Accordingly, the underfill material 122 is also utilized to fill the gaps 134.

The detector module 100 also includes a guard band 140 that is configured to circumscribe the sidewalls 114 of the detector 102. More specifically, the guard band 140 is configured to completely surround or form a boundary around the sidewalls 114. The configuration of the guard band 140 is described in more detail below.

The detector module 100 also includes a high-voltage (HV) strip 150, e.g. an electrical conductor that has a first end 152 and a second end 154. In various embodiments, the first end 152 is coupled to the cathode 120 and the second end 154 is coupled via a HV pin 156 to a power source. The configuration and operation of the HV strip 150 is described in more detail below.

Figure 3:
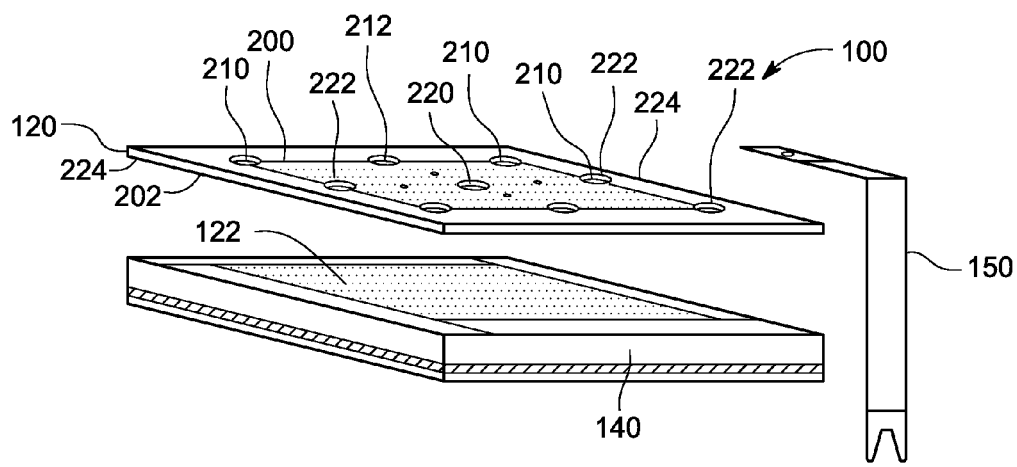
FIG. 3 is an exploded view of a portion of the detector module shown in FIG. 2 in accordance with various embodiments.
Figure 4:
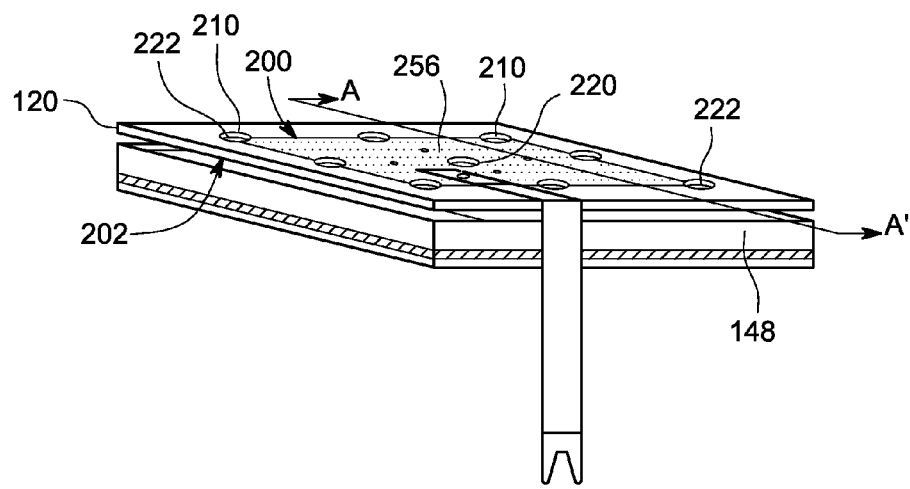
FIG. 4 is a perspective view of a portion of the detector module shown in FIG. 2 in accordance with various embodiments.

FIG. 3 is an exploded view of a portion of the detector module 100 shown in FIG. 2. FIG. 4 is a view of the portion of the detector module 100 shown in FIG. 2 after assembly, of this portion, is completed. As described above, the detector module 100 includes the detector 102, shown in FIG. 2, and the cathode plate 120. Moreover, as described above, the cathode plate 120 is separated from the detector 102 via a plurality of standoff 124 that create gaps 126 between the cathode plate 120 and the detector 102 that are filled by the underfill material 122, as shown in FIG. 2.

During operation, it is desirable that the gaps 126 are completely filled with the underfill material 122 to facilitate reducing leakage current or cross-talk signals. More specifically, the gaps 126 that are not filled with the underfill material and/or air bubbles that occur within the underfill material 122 during the injection process, may result in humidity trails being formed within the detector module 100 which may result in the leakage currents, etc. Thus, it is desirable to completely fill the gaps 126.

In the exemplary embodiment, the cathode plate 120 includes a first conductive surface 200 and an opposing second conductive surface 202. The conductive surfaces 200 and 202 may be formed using, for example, strips of copper that are attached to a PCB to form the cathode plate 120. Moreover, the cathode plate 120 includes a plurality of openings 210 extending therethrough such that a plurality of openings 210 or channels are formed between an exterior area of the detector module 100 and the gaps 126 shown in FIG. 2.

In various embodiments, the openings 210 are configured to electrically couple the first conductive surface 200 to the second conductive surface 202. More specifically, the openings 210 function as vias to enable electrical or other signals to be transmitted between the first and second conductive surfaces 200 and 202. Thus, in the exemplary embodiment, the openings 210 are lined with a conductive material 212 to create a plurality of conductive pathways between the first and second conductive surfaces 200 and 202. Alternatively, openings 210 are not lined with conductive material and conductive holes are formed in cathode plate 120 in addition to openings 210.

The openings 210 are also configured to enable the underfill material 122 to be inserted into the gaps 126. The underfill material 122 generally has a relatively low viscosity to enable the underfill material 122 to be injected into the gaps 126 using a capillary action. Capillary action, also referred to as capillary motion, or wicking, enables the underfill material 122 to be flow into the gaps 126 using gravity. Thus, it is desirable that the quantity of openings 210 formed in the cathode plate 120 be sufficient to enable the underfill material 122 to reach all the voids between the cathode plate 120 and the detector 102 via gravity.

Accordingly, in various embodiments, the quantity of openings 210 formed in the cathode plate 120 is selected to enable the underfill material 122 to fill all the voids. For example, the openings 210 include a plurality of openings 220 that are located proximate to a center of the cathode plate 120. The openings 220 therefore enable the underfill material 122 to be injected into voids proximate to the center of the cathode plate 120. Additionally, the plurality of openings 210 include a plurality of openings 222 that are disposed near the edges 224 of the cathode plate 120 to enable the underfill material 122 to be injected into voids proximate to the edges of the cathode plate 120 and to fill the voids in the corners formed by the cathode plate 120, the guard band 140, and the detector 102.

In operation, the openings 210 (including openings 220 and 222) therefore enable any voids between the cathode plate 120, the guard band 140, and the detector 102, thus reducing and/or eliminating any humidity trails that may form, especially humidity trails near the corners of the cathode plate 120 and the guard band 140. Additionally, humidity trails may form between the detector 102, cathode plate 120 and the AFE 130. Thus, the openings 210 also facilitate improving the installation of the underfill material 122 in this location as shown in FIG. 2 to disconnect possible electrical paths formed, by humidity, between detector 102, cathode-plate 120 and AFE 130.

Thus, the openings 210 in the cathode plate 120 enable the underfill material 122 to be injected into a plurality of different locations between the cathode plate 120 and the detector 102 thus increasing the volume of underfill 122 and reducing and/or eliminating the quantity of unfilled voids or bubbles between the cathode plate 120 and the detector 102. It should therefore be realized, that during operation the reduced quantity of voids facilitates reducing and/or eliminating humidity trails within the detector module 100. As a result, a quantity of leakage currents is reduced, a quantity of false events is therefore reduced, and the quality of a reconstructed image is increased.

Figure 5:
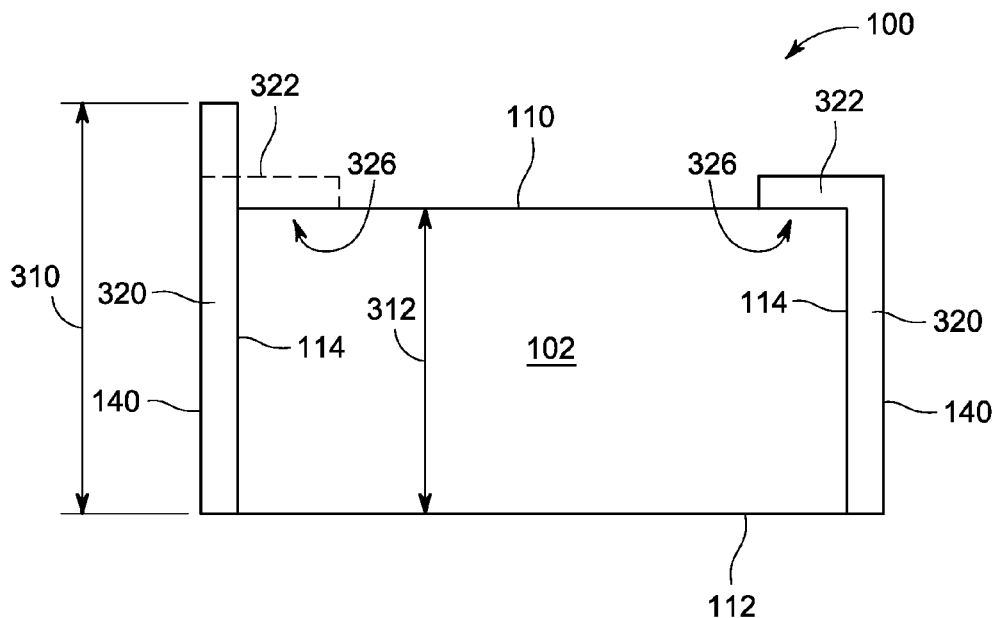
FIG. 5 is a side cross-sectional view of a portion of the detector module shown in FIG. 2 in accordance with various embodiments.
Figure 6:
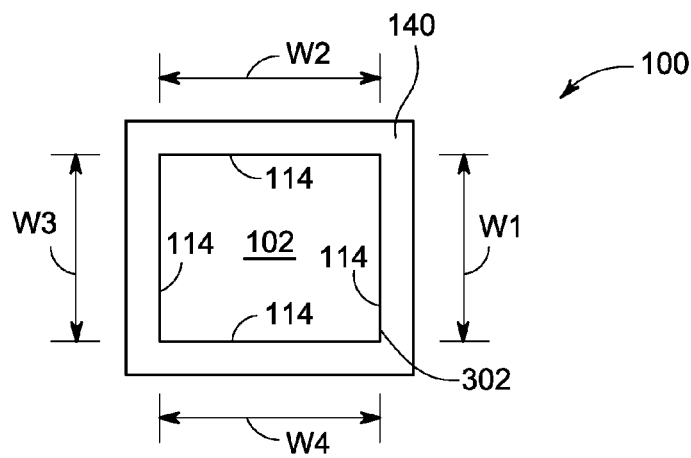
FIG. 6 is a top view of a portion of the detector module shown in FIG. 2 in accordance with various embodiments.
Figure 7:
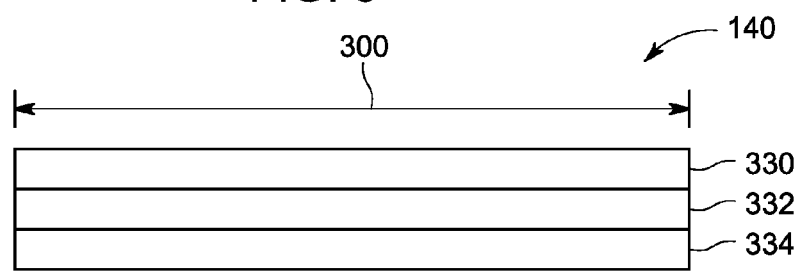
FIG. 7 is a side cross-sectional view of a guard band formed in accordance with various embodiments.

FIG. 5 is a side cross-sectional view of a portion of the detector module 100 shown in FIG. 2. FIG. 6 is a top view of a portion of the detector module 100 shown in FIG. 2. FIG. 7 is a side cross-sectional view of a guard band 140 shown in FIG. 2. As described above, the guard band 140 is utilized to cover both the sidewalls 114 of the detector 102 and also to partially overlap the first surface 110 of the detector 102. In operation, the guard band 140 functions to reduce and/or eliminate e-h recombinations that may occur proximate to the sidewalls 114 of the detector 102. Bending guard band 140 around the edges or sidewalls 114 of detector 102 ensures electrical insulation there since the under fill does not cover these edges properly due to its surface tension.

Accordingly, and in various embodiments, the guard band 140 has a length 300 that is selected to extend about a circumference 302 of the detector 102 (shown as W1+W2+W3+W4) in FIG. 6. Thus, the length 300 of the guard band 140 is sufficient to substantially encapsulate, surround, or cover the detector sidewalls 114. The starting and ending points of guard band 140 are shown as being smoothly joined together to appear as one piece without stitching. The guard band 140 also has a width 310 that is selected to be greater than a thickness 312 of the detector 102. To better explain the relationship between the width 310 and the thickness 312, the portion of the guard band 140 on the left side of the detector 102 is shown in an unfolded configuration, whereas the right side of the guard band 140 is shown in the folded condition. Thus the guard band 140 includes a sidewall segment 320 and an upper rim segment 322 that is formed unitarily with the sidewall segment 320. The installation of the guard band 140 on the detector 102 is described in more detail below.

Referring to FIG. 7, the guard band 140 is formed to include a first layer 330, a second layer 332, and a third layer 334. In the exemplary embodiment, the second layer 332 is disposed between the first and third layers 330 and 334, respectively. Moreover, the first and third layers 330 and 334 are bonded to the second layer 332 to form the guard band 140. In one embodiment, the second layer is formed from an electrically conductive material. Moreover, the first and third layers 330 and 334 are formed using a non-conductive material such that the first and third layers 330 and 334 form electrical insulators around the second conductive layer 332. The insulating layers 330 and 334 may be formed using, for example, an insulating tape, a spray of insulating material, an evaporation of insulating material, or any other suitable insulating material. Moreover, the insulating layers 330 and 334 may be affixed to the conductive layer 332 using a brushing procedure, for example, an insulating paint type substance, etc.

In operation, the guard band 140 facilitates reducing and/or eliminating recombinations of electron-hole pair proximate to the sidewalls 114 and the top edges of the detector 102. For example, because the guard band 140 has a width 310 that is greater than the thickness 312 of the detector 140, the sidewall segment 320 substantially covers the sidewalls 114. Because the sidewalls 114 are covered by the guard band 140, the performance of the pixels located proximate to the sidewalls is also improved. More specifically, the guard band 140 facilitates rejecting charges that collect proximate to the sidewalls 114 which is a recombination center in the detector 102. Thus, recombinations are reduced and the overall performance of pixels proximate to the sidewalls 114 is increased.

Moreover, the guard band 140 also generally covers the edges or sidewalls 114 of detector 102 such that when the underfill 122 is injected into the detector 102, the effects of surface tension enables the underfill 122 to fill any voids near the corners of the detector 102 which are not covered by the guard band 140.

As described above, the guard band 140 is also configured to at least partially overlap the first surface 110 of the detector 102 such that the upper rim segment 322 of the guard band 140 projects beyond the first surface 110 of the detector 102. Moreover, as shown in FIG. 5, for example, the upper rim segment 322 is folded over a peripheral region 326 of the first surface 110 of the detector 102 along the circumference 302 of the detector 102. Thus, in various embodiments, the guard band 140 is folded at a point that enables the upper rim segment 322 to be affixed to the first surface 110.

Figure 8:
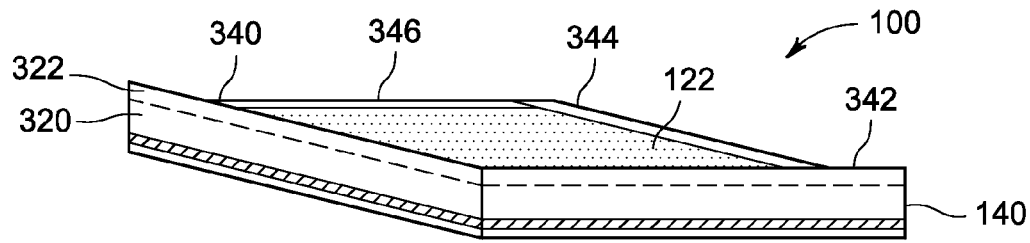
FIG. 8 is a perspective view of a guard band in a first installation position in accordance with various embodiments.
Figure 9:
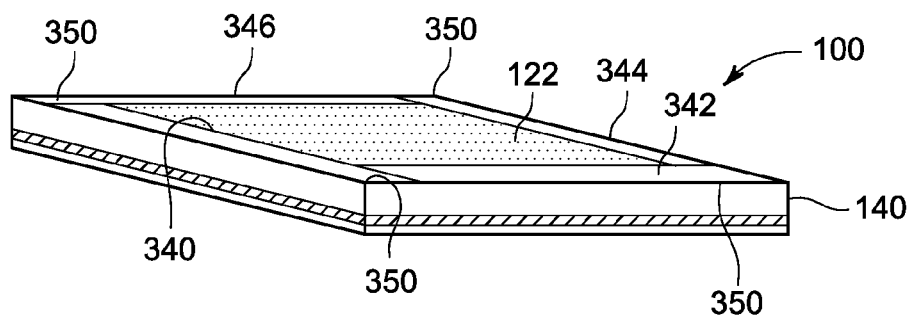
FIG. 9 is a perspective view of the guard band shown in FIG. 8 in a second installation position in accordance with various embodiments.

For example, FIG. 8 is a perspective view of the guard band 140 in a first installation position and FIG. 9 is a perspective view of the guard band shown in FIG. 8 in a second installation position. As described above, the guard band 140 is formed as two segments or portions that include the sidewall segment 320 and the upper rim segment 322 both shown in FIG. 8. During installation, the sidewall segment 320 is affixed to the sidewalls 114 of the detector 102 as described above. Additionally, the upper rim segment 322 is configured to fold at approximately a ninety degree angle from the sidewall segment 320 to cover the peripheral region 326 of the first surface 110 along the circumference 302 of the detector 102. In one embodiment as shown in FIGS. 8 and 9, the four corners of the guard band 140 are cut or separated such that the upper rim segment 322 of the guard band 140 forms four upper rim segment portions 340, 342, 344, and 346. The four upper rim segment portions 340, 342, 344, and 346 are then bent radially inwardly such that the ends 350 of each of the four upper rim segment portions overlap at the corners of the detector 102 as shown in FIG. 9. Thus, the areas of the upper rim segment 322 proximate to the corners of the detector 102 have two layers of guard band.

Figure 10:
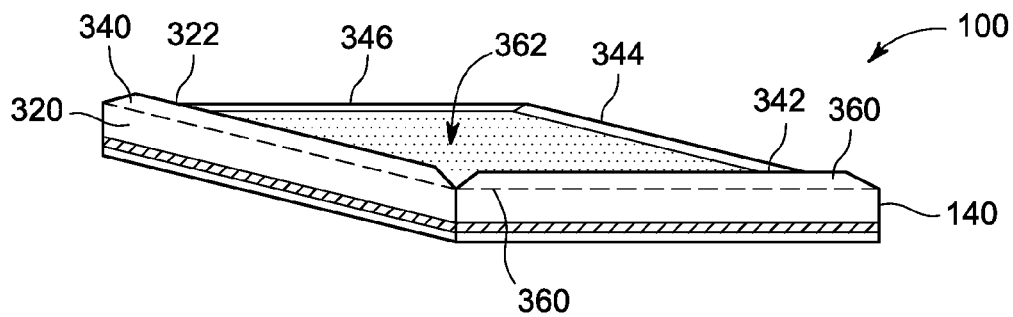
FIG. 10 is a perspective view of another guard band in a first installation position in accordance with various embodiments.
Figure 11:
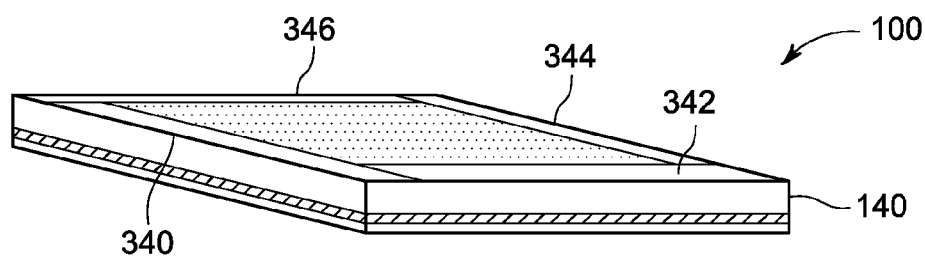
FIG. 11 is a perspective view of the guard band shown in FIG. 10 in a second installation position in accordance with various embodiments.

As another example, FIG. 10 is a perspective view of the guard band 140 in another first installation position and FIG. 11 is a perspective view of the guard band shown in FIG. 10 in a second installation position. In this embodiment, the four corners of the guard band 140 are removed such that the ends 360 of each of the four upper rim segment portions 340, 342, 344, and 346 have a substantially triangular shape 362. The four upper rim segment portions 340, 342, 344, and 346 are then bent or folded radially inward such that the ends 360 of each of the four upper rim segment portions 340, 342, 344, and 346 do not overlap the ends of the other four upper rim segment portions 340, 342, 344, and 346 as shown in FIG. 11. Thus, the areas of the upper rim segment 322 (shown in FIG. 10) proximate to the corners of the detector 102 have a single layer of guard band 140 and thus has an overall height that is less than the overall height of the detector module wherein the upper rim segment 322 overlaps at the corners as shown in FIGS. 8 and 9.

Figures 12, 13:
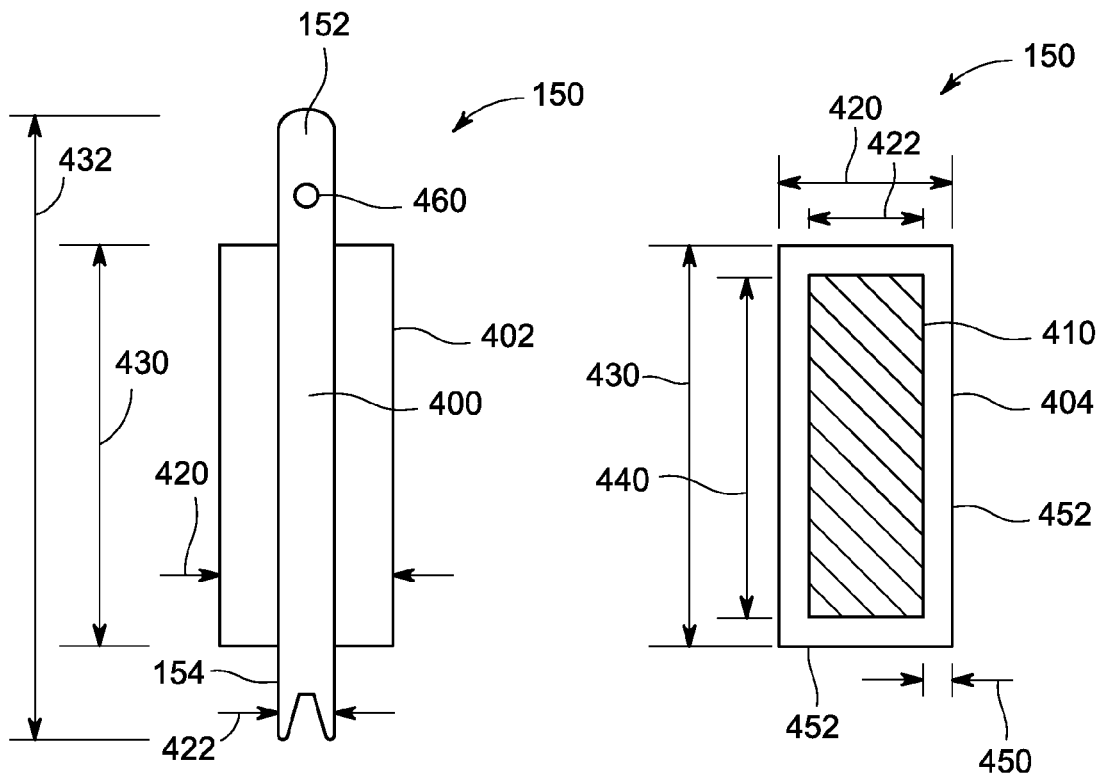
FIG. 12 is a top sectional view of a high voltage (HV) strip formed in accordance with various embodiments.
FIG. 13 is a top view of a portion of the strip shown in FIG. 12 in accordance with various embodiments.
Figure 14:
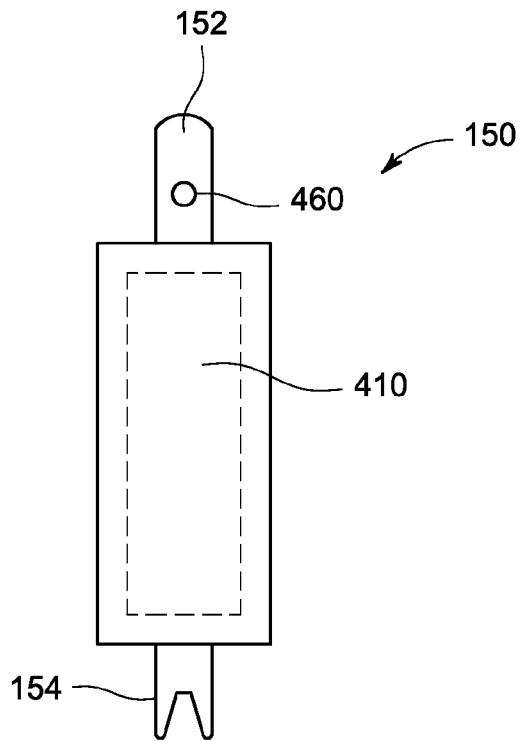
FIG. 14 is a top assembled view of the HV strip shown in FIG. 12 in accordance with various embodiments.
Figure 15:
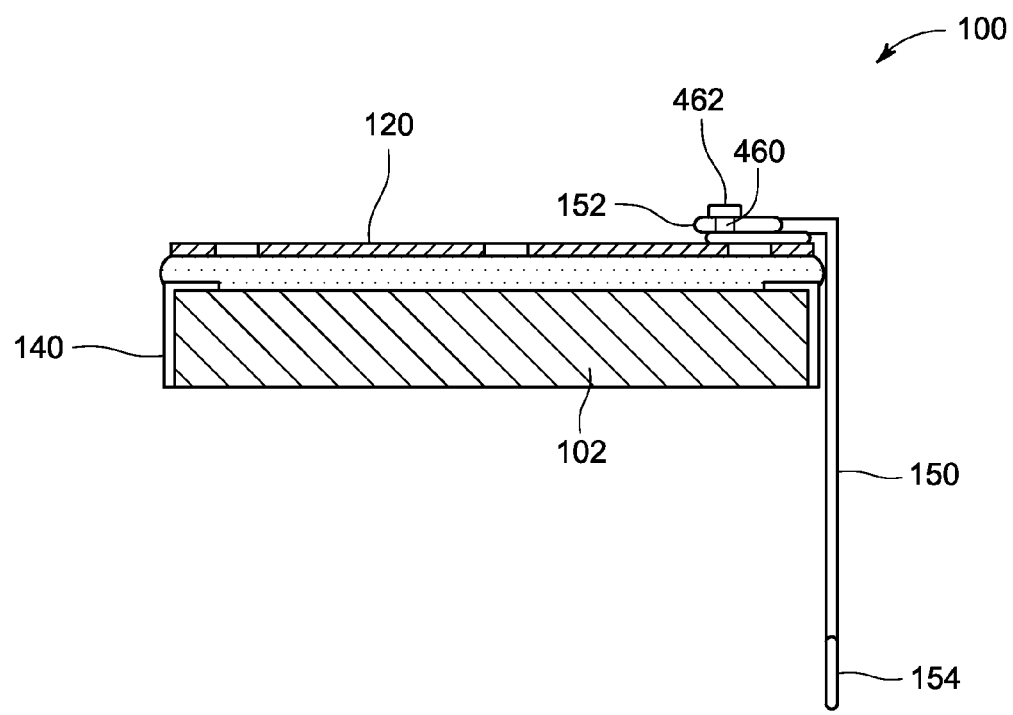
FIG. 15 is a side sectional view of the detector module shown in FIG. 3 in accordance with various embodiments.

FIG. 12 is a top sectional view of the HV strip 150 shown in FIGS. 3 and 4. FIG. 13 is a top view of a portion of the HV strip 150 shown in FIG. 12. FIG. 14 is a top assembled view of the HV strip 150 shown in FIG. 12. FIG. 15 is a side sectional view of the HV strip 150 shown in FIGS. 3 and 4. As described above, the HV strip 150 has a first end 152 and a second end 154. In various embodiments, the first end 152 is coupled to the cathode 120 and the second end 154 is coupled via HV pin 156 to a power source as shown in FIG. 2. The configuration and operation of the HV strip 150 is now explained.

The HV strip 150 includes a metallic conductor 400, a first insulating layer 402 and a second insulating layer 404. In various embodiments, either the first insulating layer 402 or the second insulating layer 404 has an adhesive layer 410 formed thereon. It should be realized that although the illustrated embodiment shows the adhesive layer 410 attached to the second layer 404, the adhesive layer 410 may also be attached to the first layer 402. In the exemplary embodiment, the adhesive layer 410 is attached to only one of the insulating layers 402 or 404.

In the exemplary embodiment, the first and second insulating layers 402 and 404 have a width 420 that is greater than a width 422 of the metallic conductor 400. Moreover, the first and second insulating layers 402 and 404 have a length 430 that is less than a length 432 of the metallic conductor 400 to enable the first and second ends 152 and 154 of the metallic strip 150 to remain exposed for coupling to the cathode plate 120 and the HV pin 156, respectively as described above.

In various embodiments, the adhesive layer 410 may be implemented as a double-side adhesive tape that is configured to adhere to both the first and second insulating layers 402 and 404, respectively. Optionally, the adhesive layer 410 may be implemented using any suitable adhesive. As shown in FIG. 13, the adhesive layer 410 has a length 440 that is less than the length 430 of the insulating layer 404. Moreover, the adhesive layer 410 has a width 442 that is less than the width 420 of the insulating layer 404. Thus, in the exemplary embodiment, the length 440 and the width 442 of the adhesive layer 410 are each selected to be less than the length and width, 420 and 430, respectively of the insulating layer 404 such that the adhesive layer 410 extends a predetermined distance 450 from the edges 452 of he second insulation layer 404 when the first and second insulation layers 402 and 404 are bonded together.

In operation, when the insulating layer 402 is bonded to the insulating layer 404, maintaining the adhesive a predetermined distance from the edges of the insulating layers facilitates preventing excess adhesive material from forming directly at the edges of the HV strip 150. Preventing excess adhesive proximate to the edges facilitates reducing condensation and humidity trails that may be created by excess adhesive near the edges. Thus, false-events that may occur as a result of excess adhesive are reduced and/or eliminated.

Referring now to FIG. 15, as described above, the HV strip 150 has a first end 152 that is coupled to a top surface of the cathode plate 120. In operation, coupling the HV strip 150 to the top surface of the cathode plate 120 enables an increased quantity of underfill material 122 to be injected into the gaps 126. The HV strip 150 has a second end 154 that is coupled to the HV pin 156 shown in FIG. 2.

In various embodiments, and referring again to FIG. 12, the HV strip 150 further includes an opening 460 formed through the first end 152 of the metallic conductor 400. During assembly, a conductive epoxy 462 is injected into the opening 460 to couple the HV strip 150 to the cathode plate 120. The conductive epoxy 462 also facilitates increasing a mechanical strength between the HV strip 150 and the cathode plate 120.

In another embodiment, and as described above condensation trails may occur between adjacent detector modules mounted on the same DCB, such as the detector modules 12 shown in FIG. 1. Accordingly, in another exemplary embodiment, the detector module 100 described above is configured to maintain a predetermined amount of space between itself and an adjacent detector module.

More specifically, when the detector modules 12 are assembled on the DCB 14 as shown in FIG. 1, a gap 474 between the detector modules 12 is formed. In some instances, the gap may be sufficiently narrow to depress the HV strip 150 against the side of the detector module. Moreover, the gap may be sufficiently narrow to enable a humidity trail to be formed between adjacent detector modules.

Accordingly, and referring to FIG. 2, in various embodiments a width 470 of the AFE 130 is sized to be greater than a width 472 of the detector 102. Thus, a gap 474 having a predetermined size is formed between adjacent detector modules 12 as shown in FIG. 1. As shown in FIG. 2, the gap 474 has a substantially triangular shape to both reduce and/or eliminate humidity trails between adjacent detector modules. Moreover, the gap 474 also facilitates preventing the HV strip 150 from be compressed between the adjacent detector modules.

The various embodiments described herein provide for improved HV strips, cathode plates, and guard bands. Moreover, the various embodiments described herein therefore facilitate reducing and/or eliminating various humidity trails in the detector module which may result in false events being detected.

Various embodiments may be used in combination with gamma ray detectors (also referred to herein as gamma detectors) in a positron emission tomography (PET) system having a PET detector assembly. However, it should be appreciated that the gamma detectors and various embodiments may be implemented in different types of imaging and non-imaging systems.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), ASICs, logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A detector module for detecting photons, said detector module comprising:
    a direct conversion detector formed from a semiconductive material, the detector having a first surface, an opposing second surface, and a plurality of sidewalls extending between the first and second surfaces; and
    a guard band coupled to the sidewalls, the guard band including a conductive layer and two insulation layers, the conductive layer confined between the two insulation layers, wherein the guard band is disposed around an exterior of the sidewalls, surrounding the detector, with one of the two insulation layers contacting the sidewalls, wherein the semiconductive material is isolated from the conductive layer of the guard band, the guard band having a length that extends along a circumference of the detector, the guard band having a width that is greater than a thickness of the detector such that an upper rim segment of the guard band projects beyond the first surface of the detector, the upper rim segment being folded over a peripheral region of the first surface along the circumference of the detector, the guard band configured to reject electrons from the sidewalls to reduce electron-hole (e-h) recombinations proximate to the edges of the detector, the guard band configured to continuously expose the one of the two insulation layers contacting the sidewalls to the sidewalls along the peripheral region of the first surface and to expose the one of the two insulation layers to at least a portion of an area of the first surface.

2. The detector module of claim 1, wherein the detector is fabricated from a cadmium-zinc-telluride (CZT) material, the detector module further comprising a cathode plate attached to the first surface.

3. The detector module of claim 1, wherein the guard band comprises:
    a conductor having a first side and an opposing second side;
    a first insulation layer of the two insulation layers coupled to the first side and disposed along an entire length of the conductor; and
    a second insulation layer of the two insulation layers coupled to the second side and disposed along the entire length of the conductor.

4. The detector module of claim 1, wherein the detector module further comprises a cathode plate attached to the first surface, a plurality of underfill injection openings, and standoffs disposed between the detector and the cathode plate, the underfill injection openings extending through the cathode plate, the underfill injection openings configured to receive an underfill material therethrough, the standoffs defining underfill gaps, the underfill gaps in fluid communication with the underfill injection openings and configured to receive the underfill material.

5. The detector module of claim 1, wherein the detector module further includes:
    a cathode plate attached to the first surface; and
    a high-voltage (HV) strip coupled to the cathode plate, the high voltage strip including,
    a conductor having a first side and an opposing second side;

a first insulation layer of the two insulation layers coupled to the first side;

a second insulation layer of the two insulation layers coupled to the second side, and an opening extending through the conductor and the first and second insulation layers, the opening configured to receive a conductive epoxy therethrough to electrically bond the HV strip to the cathode plate.

6. The detector module of claim 5, wherein the first insulation layer comprises an adhesive material to bond the first insulation layer to the second insulation layer, the adhesive material configured to extending a predetermined distance from a first edge and a second edge of the first and the second insulation layers when the first insulation layer is bonded to the second insulation layer.

7. The detector module of claim 5, wherein the opening extending through the conductor, the opening configured to receive a conductive epoxy therethrough to bond the conductor to a surface of the cathode plate.

8. The detector module of claim 1, further comprising an analog front-end (AFE) board coupled to the detector, the AFE board having a width that is greater than a width of the detector.

9. A radiation detector comprising:
a Detector Carrier Board (DCB); and
a plurality of detector modules coupled to the DCB, at least one of the detector modules including,
a direct conversion detector formed from a semiconductive material, the detector having a first surface, an opposing second surface, and a plurality of sidewalls extending between the first and second surfaces,
a cathode plate attached to the first surface, the cathode plate including a plurality of underfill injection openings extending therethrough, the underfill injection openings configured to receive an underfill material therethrough, and
a guard band coupled to the sidewalls, the guard band including a conductive layer and two insulation layers, the conductive layer confined between the two insulation layers, wherein the guard band is disposed around an exterior of the sidewalls, surrounding the detector, with one of the two insulation layers contacting the sidewalls, wherein the semiconductive material is isolated from the conductive layer of the guard band, the guard band having a length that extends along a circumference of the detector, the guard band having a width that is greater than a thickness of the detector such that an upper rim segment of the guard band projects beyond the first surface of the detector, the upper rim segment being folded over a peripheral region of the first surface along the circumference of the detector, the guard band configured to reject electrons from the sidewalls to reduce recombinations proximate to the edges of the detector, the guard band configured to continuously expose the one of the two insulation layers contacting the sidewalls to the sidewalls along the peripheral region of the first surface and to expose the one of the two insulation layers to at least a portion of an area of the first surface.

10. The radiation detector of claim 9, wherein the guard band comprises:
a conductor having a first side and an opposing second side;
a first insulation layer of the two insulation layers coupled to the first side and disposed along an entire length of the conductor; and
a second insulation layer of the two insulation layers coupled to the second side and disposed along the entire length of the conductor.

11. The radiation detector of claim 9, wherein the detector module further comprises a high-voltage strip coupled to the cathode plate, the high voltage strip including,
a conductor having a first side and an opposing second side;
a first insulation layer of the two insulation layers coupled to the first side; and
a second insulation layer of the two insulation layers coupled to the second side.

12. The radiation detector of claim 9, wherein the detector module further comprises an analog front-end (AFE) board coupled to the detector, the AFE board having a width that is greater than a width of the detector.

* * * * *